(12) United States Patent
Pahl et al.

(10) Patent No.: US 11,605,583 B2
(45) Date of Patent: Mar. 14, 2023

(54) HIGH-PERFORMANCE INTEGRATED CIRCUIT PACKAGING PLATFORM COMPATIBLE WITH SURFACE MOUNT ASSEMBLY

(71) Applicant: Keysight Technologies, Inc., Santa Rosa, CA (US)

(72) Inventors: Philipp Pahl, Santa Rosa, CA (US); Colin March, Santa Rosa, CA (US); John Westerman, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 692 days.

(21) Appl. No.: 16/552,055

(22) Filed: Aug. 27, 2019

(65) Prior Publication Data

US 2020/0211950 A1    Jul. 2, 2020

Related U.S. Application Data

(60) Provisional application No. 62/787,726, filed on Jan. 2, 2019.

(51) Int. Cl.
*H01L 23/495* (2006.01)
*H01L 23/498* (2006.01)
(Continued)

(52) U.S. Cl.
CPC ...... *H01L 23/49838* (2013.01); *H01L 23/055* (2013.01); *H01L 24/49* (2013.01);
(Continued)

(58) Field of Classification Search
CPC . H01L 23/49838; H01L 23/055; H01L 24/49; H01L 2924/14; H01L 2924/30105; H01L 2924/30107
(Continued)

(56) References Cited

U.S. PATENT DOCUMENTS 4,626,805 A    12/1986  Jones
7,245,007 B1    7/2007  Foster
(Continued)

OTHER PUBLICATIONS

Final Office Action dated Nov. 16, 2021, U.S. Appl. No. 16/724,473, 15 pgs.
(Continued)

*Primary Examiner* — Kimberly N Rizkallah
*Assistant Examiner* — Dilinh P Nguyen

(57) ABSTRACT

An integrated circuit package includes a transmission line structure, wire bonds, a first post and a second post. The transmission line structure runs from a printed circuit board (PCB) to an integrated circuit (IC) and includes a center transmission line between two ground lines and sealed from exposure to air. The wire bonds connect the transmission line structure to pads on the integrated circuit from where the center transmission line exits the integrated circuit package. The wire bonds are selected to have an impedance matched to impedance of the integrated circuit. The first post supports the center transmission line where the center transmission line enters the integrated circuit package from the printed circuit board. The second post supports the center transmission line where the center transmission line exits the integrated circuit package to connect to the wire bonds.

20 Claims, 7 Drawing Sheets

(51) Int. Cl.
    *H01L 23/00*         (2006.01)
    *H01L 23/055*      (2006.01)

(52) U.S. Cl.
    CPC .............................. *H01L 2924/14* (2013.01); *H01L 2924/30105* (2013.01); *H01L 2924/30107* (2013.01)

(58) Field of Classification Search
    USPC ........................................................ 257/676
    See application file for complete search history.

(56) References Cited

U.S. PATENT DOCUMENTS

| | | |
|---|---|---|
| 7,294,904 B1 | 11/2007 | Chee et al. |
| 7,745,911 B2 | 6/2010 | Lee et al. |
| 9,306,255 B1 * | 4/2016 | Rollin ..................... H01P 5/02 |
| 2001/0048155 A1 * | 12/2001 | Budka ................... H01L 24/49 |
| | | 257/727 |
| 2002/0106835 A1 | 8/2002 | Carter et al. |
| 2008/0246562 A1 | 10/2008 | Sherrer et al. |
| 2019/0019776 A1 | 1/2019 | Tuncer et al. |

OTHER PUBLICATIONS

Notice of Allowance dated Dec. 13, 2021, U.S. Appl. No. 16/724,473, 8 pgs.

Non-Final Office Action dated Jul. 29, 2021, U.S. Appl. No. 16/724,473, 26 pgs.

* cited by examiner

HIGH-PERFORMANCE INTEGRATED CIRCUIT PACKAGING PLATFORM COMPATIBLE WITH SURFACE MOUNT ASSEMBLY

CROSS REFERENCE TO RELATED APPLICATIONS

The present application claims priority under 35 U.S.C. § 119(e) to U.S. Provisional Application No. 62/787,726, naming Phillip Pahl, et al. inventors, and filed on Jan. 2, 2019. The entire disclosure of U.S. Provisional Application No. 62/787,726 is hereby specifically incorporated by reference in its entirety.

BACKGROUND

An integrated circuit (IC) is an electronic circuit formed on a semiconductor. Surface-mount technology (SMT) involves the production of electronic circuits by mounting or placing components such as integrated circuits directly onto the surface of printed circuit boards (PCBs). Integrated circuit packages are structures used to physically and electrically connect integrated circuits to printed circuit boards. Quad flat no-lead (QFN) packages are a popular form of SMT integrated circuit package for mounting or placing an integrated circuit onto the surface of a PCB. Known QFN packages include a series of leads, which typically have uniform cross sections, and which are made by encapsulating a frame in an epoxy material to provide isolation between the leads. Several varieties of standardized QFN packages are commercially available with various configurations. Known QFN packages may encapsulate the integrated circuit in a molding package, though some so-called air cavity QFN packages place the integrated circuit in an air cavity immediately around the integrated circuit. Use of known QFN packages including the air cavity QFN packages may impose frequency limits, as detailed below.

FIG. 1 is a bonding diagram illustrating connectivity between pads on an integrated circuit and the leads of a known QFN package. An integrated circuit 199 is placed in the QFN package 100 and wirebonds 130 are used to make connections between pads 199a on the integrated circuit 199 and leads 101 in the QFN package 100. In FIG. 1, leads 101 are labelled on three sides as 1 to 8, 9 to 16, and 17 to 24 respectively.

Known integrated circuit packages such as the QFN package 100 in FIG. 1 can deliver acceptable performance up to about 40 GHz in current designs but performance is generally limited at frequencies above 40 GHz due, for example, to impedance mismatch. It becomes difficult to maintain a consistent impedance (e.g., 50 Ohms) in the signal path due, for example, to the QFN package 100, the connections between the QFN package 100 and the PCB, and the connections between the QFN package 100 and the integrated circuit 199, and this becomes increasingly problematic at higher frequencies.

The problems arising from the connections result, for example, from the mechanical structure of the leads 101 connecting the QFN package to the integrated circuit, and the bonds used to attach the QFN package to a PCB. The mechanical structure of the leads 101 connecting to the integrated circuit 199 becomes problematic at high frequencies due, for example, to overmolding technology used to encapsulate the leads 101. Additionally, the electrical characteristics of the wirebond inductance of the leads 101 drives impedance to be too high. Other problems with the connections include the (large) size of the PCB bond pad required in the assembly process for QFN packages, as this may cause a parasitic effect. Moreover, the signal trace on the PCB that connects to the signal trace of the transmission line in the QFN package imposes a parasitic capacitance.

Other problems encountered using known QFN packages at high frequencies include that several such packages rely on potting of the integrated circuit and wirebonds to meet environmental operating requirements of various standards such as those imposed by the JEDEC Solid State Technology Association. At high operating frequencies potting is undesirable as dielectric characteristics of the potting material can degrade performance of the integrated circuit package.

Accordingly, even when some of the structures and manufacturing techniques described above are used, mechanisms for compensating for the parasitic and other effects are needed to allow for effective performance for today's high-frequency applications.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
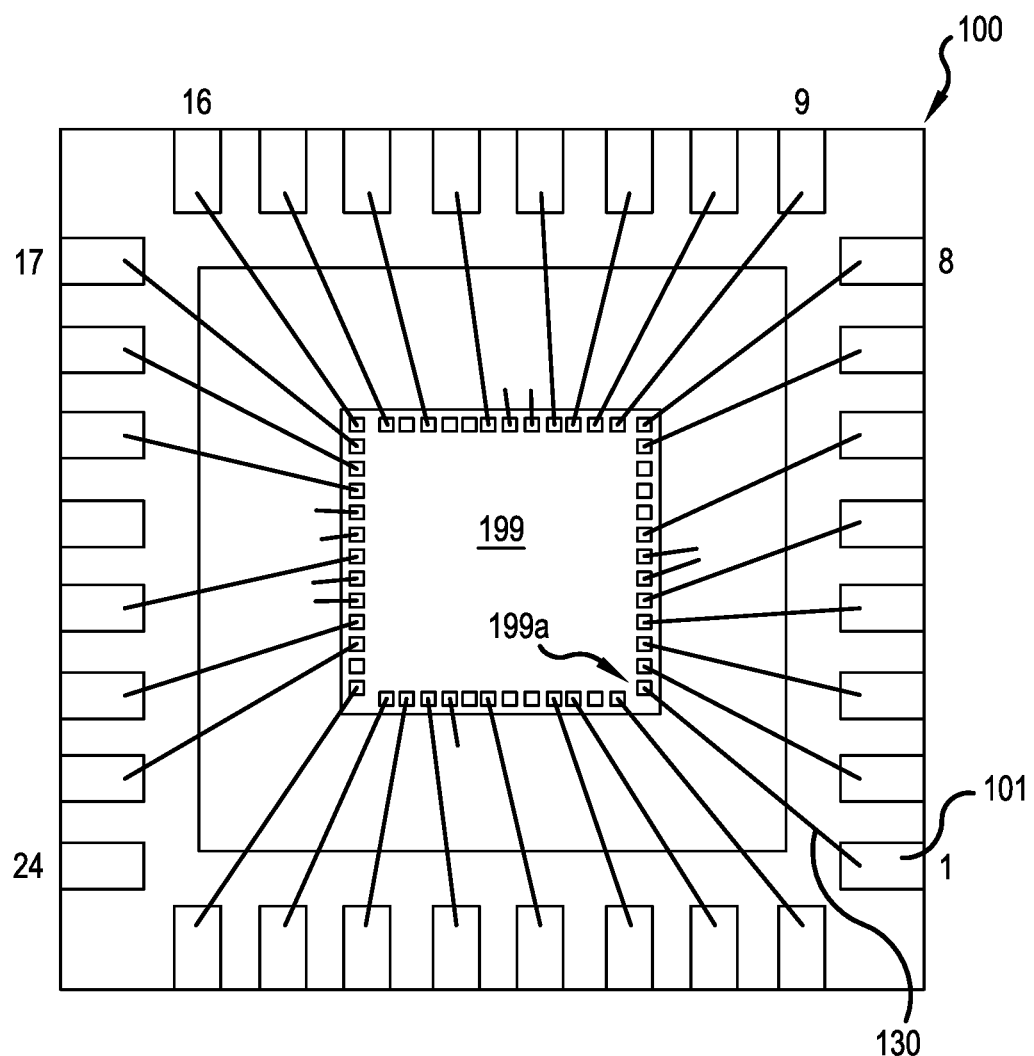
FIG. 1 is a bonding diagram illustrating connectivity between pads on an integrated circuit and the leads of a known QFN package.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms 'a', 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

In view of the foregoing, the present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

According to aspects of the present disclosure, a controlled impedance path can be provided inside of an integrated circuit package from the PCB to the integrated circuit. The controlled impedance path may be implemented with features on the PCB as well as inside the integrated circuit package in order to optimize performance of the transition from the PCB to the integrated circuit.

As described below, an integrated circuit package may provide a transmission line structure running from a PCB to an integrated circuit. The integrated circuit package described herein may be a surface mount packaging technology with a controlled impedance, may include impedance-matched bond wires, and may provide compensation for the non-ideal properties of the integrated circuit and the bond pads of the PCB to the integrated circuit package. The transmission line structure may provide for effective impedance matching throughout, which can be a key factor for high frequency performance. The integrated circuit package may provide compensation for capacitances in the transition from the PCB to the integrated circuit, to maintain the impedance at a selected level such as 50 Ohms. In this way, elements in the integrated circuit package that add unwanted capacitance can be compensated so that impedance in the signal path is maintained very close to the impedance of the integrated circuit. The wire bonds described below in relation to embodiments replace the wirebonds of the known QFN packages as in FIG. 1 and may have impedances selected to match the impedance of the integrated circuits packaged in the integrated circuit packages described herein.

Figure 2A:
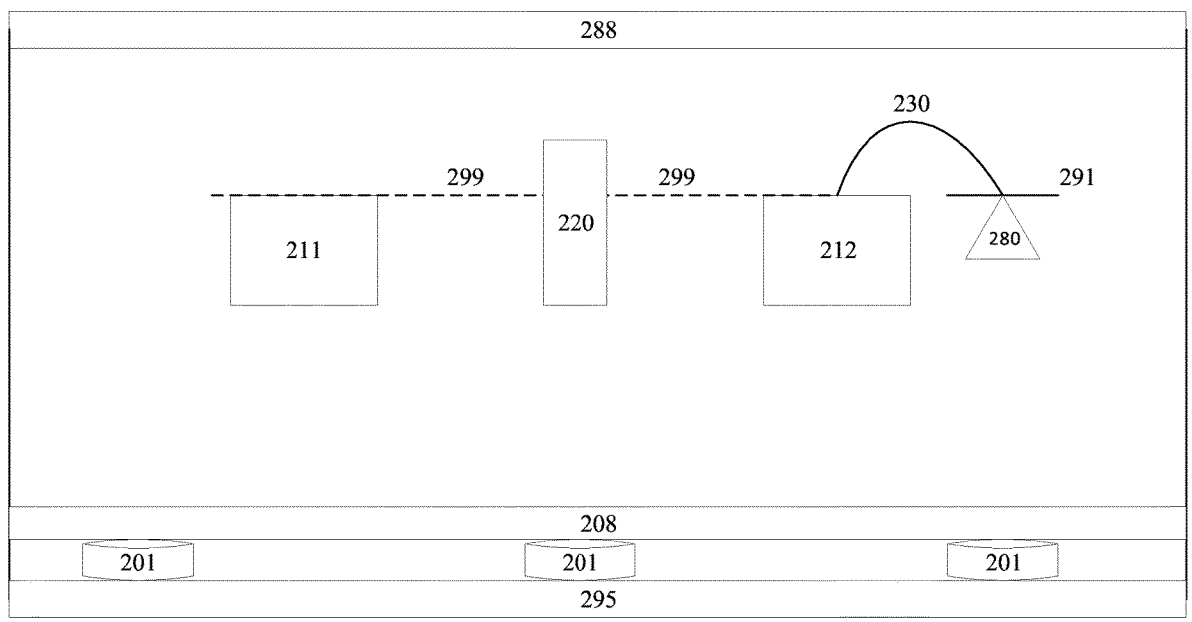
FIG. 2A illustrates a simplified block diagram of an integrated circuit package, according to representative embodiments.
Figure 2B:
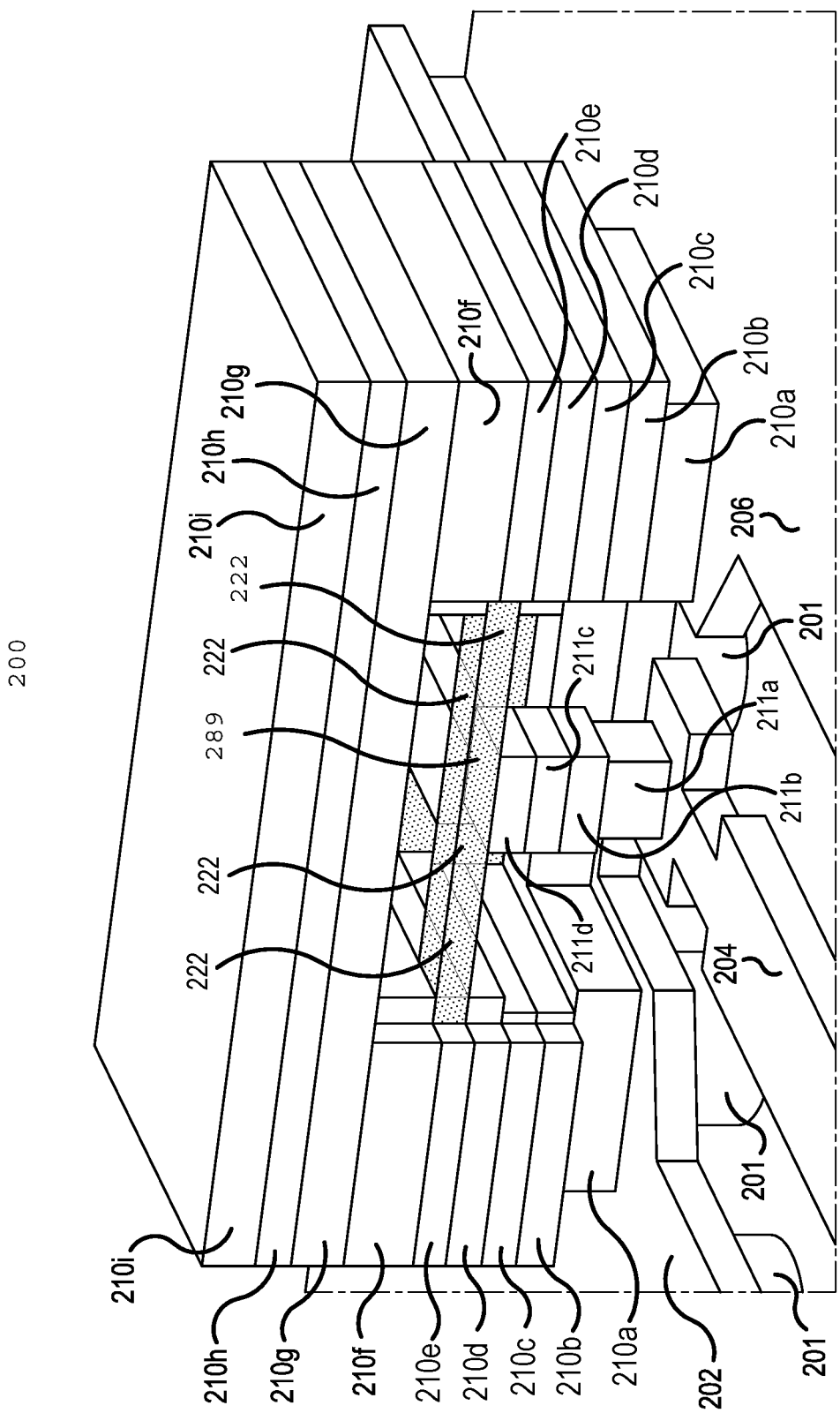
FIG. 2B illustrates a front perspective view of the integrated circuit package in FIG. 2A, according to representative embodiments.
Figure 2C:
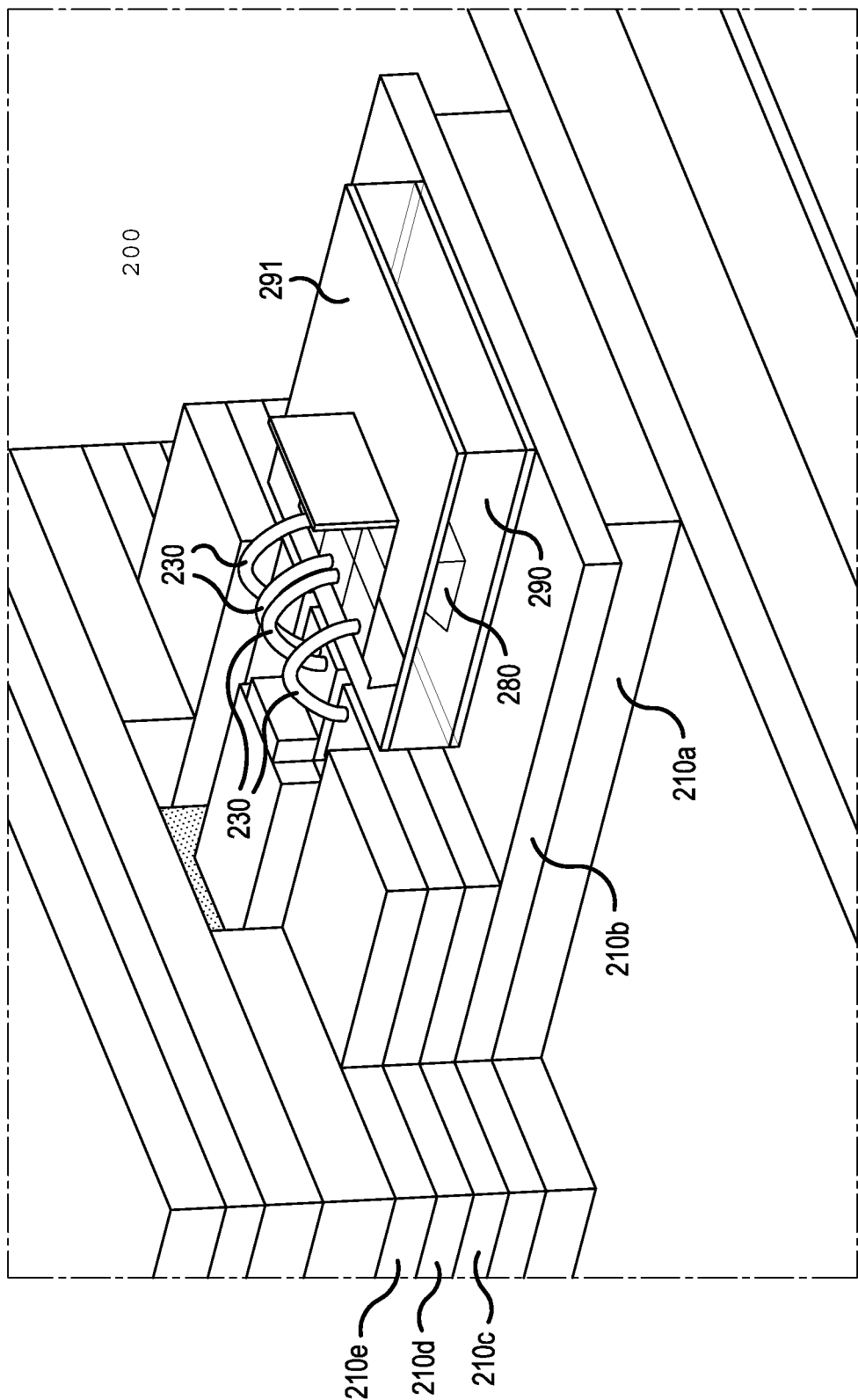
FIG. 2C illustrates a rear perspective view of the integrated circuit package in FIGS. 2A and 2B, according to a representative embodiment.
Figure 2D:
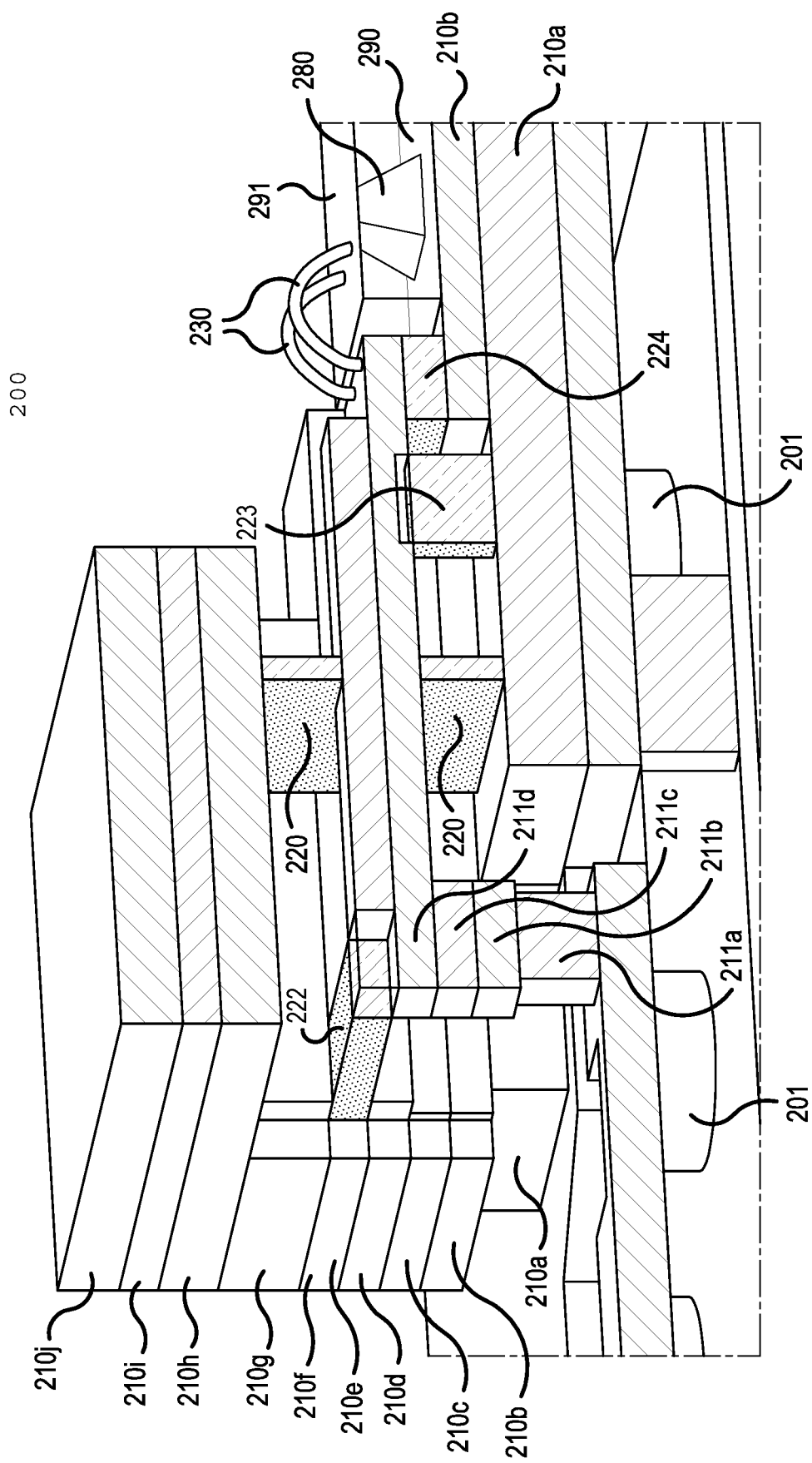
FIG. 2D illustrates a side perspective view of the integrated circuit package in FIGS. 2A, 2B and 2C, according to a representative embodiment.

A first embodiment of the present disclosure is illustrated in FIGS. 2A to 2D and explained below. In the first embodiment, FIG. 2A illustrates an integrated circuit package as a block diagram, and FIGS. 2B, 2C and 2D illustrate the integrated circuit package from different perspective views.

FIG. 2A illustrates a simplified block diagram of an integrated circuit package, according to representative embodiments.

In FIG. 2A, the integrated circuit package 200 includes a center transmission line 299 of a signal transmission structure supported on a first post 211 and a second post 212 and running through a dielectric wall 220. The center transmission line 299 terminates at wire bonds 230, and the wire bonds 230 connect the center transmission line 299 to the integrated circuit on a launch 291 for the integrated circuit. The launch 291 for the integrated circuit is supported on a pedestal via 280. The integrated circuit package 200 is sealed by a lid 288. A lowest layer 208 of the integrated circuit package 200 is supported on a PCB 295 by bond pads 201.

The center transmission line 299 is shown as a signal line that runs on top of the first post 211, through the dielectric wall 220, on top of the second post 212 and up to wire bonds 230. The center transmission line 299 is representative of high frequency transmission lines that communicate using frequencies approaching and exceeding 100 GHz. The center transmission line 299 is supported by the first post 211, the dielectric wall 220, and the second post 212 in an interior of the integrated circuit package 200. In the embodiment of FIGS. 2A to 2D, the center transmission line 299 of the signal transmission structure may be encapsulated in dielectric material. The dielectric material and the center transmission line 299 may each be considered elements of the integrated circuit package 200. Although not shown, the center transmission line 299 may be run between two ground lines. Any two such ground lines are not necessarily supported by the first post 211 or the second post 212 and are not necessarily run through the dielectric wall 220, though two such ground lines may run up to the wire bonds 230 such that separate elements of the wire bonds 230 are connected to the ground lines than are connected to the center transmission line 299.

In the embodiment of FIGS. 2A to 2D, the dielectric wall 220 and the lid 288 seal the integrated circuit from exposure to external air. Though FIG. 2A does not illustrate layers of the integrated circuit package 200 other than the lowest layer 208, the dielectric wall 220 may be provided between two such layers such as between a second layer 210b and an eighth layer 210i. The multiples layers of the integrated circuit package 200 are shown in FIGS. 2B, 2C and 2D. The dielectric wall 220 may seal a portion of the integrated circuit package that includes the integrated circuit. For example, the dielectric wall provides an environmental seal for the open space around the integrated circuit on the launch 291. The lid 288 seals the integrated circuit package 200 from the top. The dielectric wall 220 and the lid 288 may provide protection from environmental factors during assembly and operation of the integrated circuit package 200 and the integrated circuit.

The PCB 295 supports the integrated circuit package 200 from the bottom. The PCB 295 may consist of a metal such as copper. Bond pads 201 on the PCB 295 support the lowest layer 208 of the integrated circuit package 200 and are placed on the PCB 295. The bond pads 201 may also be made of a metal such as copper. The PCB 295 may be attached to the integrated circuit package 200 by, for example, soldering.

The integrated circuit is implemented on a launch 291, and the launch 291 for the integrated circuit is supported on the pedestal via 280. The dielectric 290 also helps support the integrated circuit on the pedestal via 280. An air cavity is provided around the integrated circuit and the launch 291. That is, in the embodiment of FIGS. 2A to 2D, the integrated circuit package 200 may include the air cavity around the integrated circuit and the launch 291 for the integrated circuit. The air cavity is defined in part by the dielectric wall 220 and the lid 288 and can enhance high frequency performance for the integrated circuit.

The wire bonds 230 are provided from the center transmission line 299 and any ground lines in/on the integrated circuit package 200 to the integrated circuit and can be selectively matched to impedance of the integrated circuit in advance of fabrication.

A variety of factors for the integrated circuit package 200 contribute to the control of the impedance path for the center transmission line 299. For example, dielectric 290 around the pedestal via 280 helps counter capacitance from the integrated circuit on the launch 291. The necking of the first post 211 and the second post helps offset capacitance. The wire bonds 230 can be specifically matched to the impedance of the integrated circuit. Other aspects of the control of the impedance path are explained below.

FIG. 2B illustrates a front perspective view of an integrated circuit package, according to representative embodiments.

In FIG. 2B, an integrated circuit package 200 includes several layers including a first layer 210a, a second layer 210b, a third layer 210c, a fourth layer 210d, a fifth layer 210e, a sixth layer 210f, a seventh layer 210g, an eighth layer 210h, and a ninth layer 210i. The integrated circuit package 200 consists of different layers with different geometries, such as different heights, widths or depths. The integrated circuit package 200 may be a QFM package, and the different layers are used as one aspect of the compensation compensate for capacitances to provide a controlled impedance path. As can be seen in FIG. 2B, the layers of the integrated circuit package 200 are not necessarily entirely aligned and may not have identical dimensions. Rather, the layers of the integrated circuit package 200 may have depths that vary from one another, widths that vary from one another, and lengths that vary from one another. For example, in FIG. 2B, the first layer 210a and the sixth layer 210f have depths (vertical direction on the page) greater than the depths of the second layer 210b, the third layer 210c, the fourth layer 210d, and the fifth layer 210e. Additionally, the first layer 210a has a width (horizontal direction on the page) lower than the second layer 210b and other layers of the integrated circuit package 200. The varying dimensions of layers in FIG. 2B is only an example, and in other embodiments the dimensions of the layers may all be the same or may vary in ways different than that shown in FIG. 2B. Additionally, an integrated circuit package 200 may have a different number of layers than nine in some embodiments. In embodiments herein, the layers of the integrated circuit package 200 are or may be maintained fully or partially through the transmission line structure, the first post 211 and the second post 212, even when the transmission line structure, the first post 211 and the second post 212 are separated by spaces therebetween.

In FIG. 2B, the first post 211 is not labelled, but layers of the first post 211 are labelled and shown. The first post 211 includes a first layer 211a, a second layer 211b, a third layer 211c, and a fourth layer 211d. As can be seen in FIG. 2B, the layers of the first post 211 are not necessarily entirely aligned and may not have identical dimensions. Rather, the layers of the first post 211 may have depths that vary from one another, widths that vary from one another, and lengths that vary from one another. For example, in FIG. 2B, the first layer 211a has a depth (vertical direction on the page) greater than the depths of the second layer 211b, the third layer 211c, and the fourth layer 211d. Additionally, the first layer 211a has a width (horizontal direction on the page) lower than the second layer 211b, the third layer 211c, and the fourth layer 211d. The varying dimensions of layers of the first post 211 in FIG. 2B is only an example, and in other embodiments the dimensions of the layers of the first post 211 may all be the same or may vary in ways different than that shown in FIG. 2B. Additionally, a first post 211 may have a different number of layers than four in some embodiments.

The integrated circuit package 200 in FIG. 2B also includes a second post 212 that is not shown in FIG. 2B but is on the opposite side of the integrated circuit package 200 from the first post 211 such that the second post 212 is hidden from view in FIG. 2B. The integrated circuit package 200 in FIG. 2B also includes a transmission line structure running from a PCB beneath the integrated circuit package 200 to an integrated circuit. The integrated circuit package 200 in FIG. 2B also includes wire bonds 230 that are also not shown in FIG. 2B but are on the opposite side of the integrated circuit package 200 from the first post 211 such that the wire bonds 230 are hidden from view in FIG. 2B. The first post 211 is provided towards a launch from the PCB 295. The second post 212 is provided towards the launch 291 from the integrated circuit. The first post 211 and the second post 212 provide a necking of the transmission line structure to provide compensation for capacitance resulting from connecting the printed circuit board to the integrated circuit package 200.

The transmission line structure of the integrated circuit package 200 in FIG. 2B includes a center transmission line 299 provided between two ground lines and is sealed from exposure to air. The transmission line structure may seal the center transmission line 299 and the two ground lines, though the center transmission line 299 may be spaced from each of the two ground lines. Additionally, the center transmission line 299 may also be sealed by a sealant such as an epoxy or even a coating that seals the center transmission line 299. For example, the integrated circuit package 200 may include a coating around the center transmission line 299 that seals the center transmission line 299 from exposure to air.

As an example, a commercially available coating such as "signal seal" from GVD may be used in place of or in addition to the dielectric wall 220. Such coatings may have dielectric properties that can impact the performance of the integrated circuit but can be applied thinly such that the overall impact to the performance of the integrated circuit is negligible.

In FIG. 2B, the center transmission line 299 structure includes a port 289 in a middle section of the fifth layer 210e. The center transmission line 299 and the two ground lines may run through the integrated circuit package 200 in the port 289 from the first post 211 that supports the center transmission line 299 where the center transmission line 299 enters the integrated circuit package 200 from the printed circuit board to the second post 212 that supports the center transmission line 299 where the center transmission line 299 exits the integrated circuit package 200 to connect to the wire bonds 230.

The wire bonds 230 of the integrated circuit package 200 in FIG. 2B connect the transmission line structure to pads on the integrated circuit from where the center transmission line 299 exits the integrated circuit package 200. The wire bonds 230 are selected to have an impedance matched to impedance of the integrated circuit.

The first post 211 supports the center transmission line 299 where the center transmission line 299 enters the integrated circuit package 200 from the printed circuit board. The second post 212 supports the center transmission line 299 where the center transmission line 299 exits the integrated circuit package 200 to connect to the wire bonds 230. The second post 212 serves as a power capacitor to compensate for inductance of the bonds of the pedestal via 280 and capacitance of the integrated circuit. That is, in the embodiment of FIGS. 2A to 2D, the second post 212 may serve as a power capacitor to compensate for inductance of the bonds supporting the integrated circuit to the printed circuit board.

The integrated circuit package 200 in FIG. 2B includes several dielectric layers that serve a variety of purposes. A first dielectric layer 222 holds the first post 211 in position in what would otherwise be open space in the fifth layer 210e of the integrated circuit package 200. The first dielectric layer 222 is a dielectric holding the first post 211 in place. That is, the first dielectric layer 222 is a dielectric material that holds the first post 211 in position.

As described herein, dielectric such as the first dielectric layer 222 also is used to seal the inside of the integrated circuit package 200 from the outside of the integrated circuit package 200. The sealing of the inside of the integrated circuit package 200 may prevent air and moisture from entering and interfering with functionality such as high frequency signaling.

The integrated circuit package 200 in FIG. 2B includes three sections of a lowest layer on the bottom, including a first section 202 on the left, a second section 204 in the middle, and a third section 206 on the right. Bond pads 201 on the PCB under the integrated circuit package 200 connect the PCB to the lowest layer 208 on the bottom of the integrated circuit package 200. These bond pads 201 may be essential for bonding the integrated circuit package 200 but are the primary cause or one of the primary causes of the impedance mismatch addressed by the integrated circuit packages described herein. The construction of the PCB in the embodiment of FIGS. 2A to 2D can contribute to the performance of the integrated circuit package 200. For example, materials used for high frequency PCB construction may have a low dielectric loss and a low dielectric constant. Low dielectric loss may reduce the loss of microstrip and stripline transmission lines in the PCB where loss is directly proportional to frequency. Low dielectric constant may allow for fabrication of the integrated circuit package 200 with a center transmission line 299 having low conductive losses with resonant free performance. Commercially available materials for the PCB which have these properties include Tachyon 100G from Isola group and EZIO from Taconic.

FIG. 2C illustrates a rear perspective view of the integrated circuit package in FIG. 2B, according to a representative embodiment.

In FIG. 2C, the integrated circuit package 200 includes some or all of the same layers shown from the front perspective view in FIG. 2B, including the first layer 210a, the second layer 210b, the third layer 210c, the fourth layer 210d, and the fifth layer 210e. The wire bonds 230 connecting the center transmission line 299 and two ground lines in the transmission line structure to the integrated circuit on the launch 291 for the integrated circuit are also included in the integrated circuit package 200. A pedestal via 280 is provided beneath the launch 291 for the integrated circuit. Dielectric 290 is provided around the pedestal via 280. That is, the integrated circuit package 200 in FIG. 2C includes the pedestal via 280 that supports the integrated circuit to the printed circuit board 205, and dielectric 290 disposed around on the pedestal via 280.

Although not labelled in FIG. 2C, the top layer of the second post 212 is provided immediately under the center two wire bonds of the wire bonds 230. The second post 212 may include a first layer 212a, a second layer 212b, a third layer 212c, and a fourth layer 212d, each commensurate in height with corresponding layers of the first post 211 and of the main portions of the integrated circuit package. For example, the first layer 212a may be the same height as the first layer 211a and the first layer 210a. The second layer 212b may be the same height as the second layer 211b and the second layer 210b. The third layer 212c may be the same height as the third layer 211c and the third layer 210c. The fourth layer 212d may be the same height as the fourth layer 211d and the fourth layer 210d. The first post 211 and the second post 212 may be fabricated at the same time and in the same process as the remainder of the integrated circuit package 200. For example, each of the layers may be deposited together and then selectively isolated from one another by etching or an analogous process.

As seen in FIG. 2C, the launch 291 for the integrated circuit, the pedestal via 280 and the dielectric 290 are provided on the second layer 210b of the integrated circuit package 200. Additionally, in FIG. 2C several of the wire bonds 230 are connected to the integrated circuit on the launch 291 for the integrated circuit from the fourth layer 210d, whereas two of the four wire bonds 230 in the center are connected to the center transmission line 299 which generally corresponds to the port 289 in FIG. 2B. In an embodiment, the two ground lines may be extended to end proximate to the integrated circuit by, for example, extending that portion of the fourth layer 210d that passes the ground lines on each side of the two wire bonds 230 in the middle.

FIG. 2D illustrates a side perspective view of the integrated circuit package in FIGS. 2A and 2B, according to a representative embodiment.

In FIG. 2D, portions of several layers of the integrated circuit package 200 are cut out to shown elements in the interior of the integrated circuit package 200. On the left side in FIG. 2D, ten layers are shown including the first layer 210a, the second layer 210b, the third layer 210c, the fourth layer 210d, the fifth layer 210e, the sixth layer 210f, the seventh layer 210g, the eighth layer 210h, the ninth layer 210*i*, and the tenth layer 210*j*. Additionally, the four layers of the first post 211 are shown, including the first layer 211*a*, the second layer 211*b*, the third layer 211*c*, and the fourth layer 211*d*. Wire bonds 230 are shown on the upper right connecting to the integrated circuit on the launch 291. Additionally, the pedestal via 280 surrounded by the dielectric 290 is also labelled in FIG. 2D.

In FIG. 2D, the second post 212 is shown beneath the left side of the wire bonds 230. The second post 212 includes the right side of the fourth layer 211*d*, along with a dielectric layer 224, and the second layer 210*b* of the integrated circuit package 200.

In FIG. 2D, the bond pads 201 are shown beneath the lowest layer 208 of the integrated circuit package 200. As noted previously, the bond pads 201 may be a primary cause of the impedance mismatch addressed by the integrated circuit packaged described herein. These bond pads 201 may require a certain size for manufacturing and may be non-ideal in terms of electromechanical properties. In the integrated circuit package 200, the bond pads 201 may be provided with several forms of additional compensation structures, such as from the second section 204 in the middle of the lowest layer 208 in FIG. 2A. The second section 204 in the middle of the lowest layer 208 in FIG. 2A is shown with a taper, and this taper may exist to compensate for capacitance from the bond pads 201. Additionally, the first layer 211*a* of the first post 211 is narrower in width and depth than other layers of the first post 211. The narrowing of the first layer 211*a* may be provided as a compensation structure to contribute to offsetting of capacitance from the bond pads 201.

In the integrated circuit package 200 shown in FIGS. 2A, 2B and 2C, a sealed transmission line runs through the transmission line structure that also includes ground lines. The sealed transmission line is sealed by a dielectric wall 220 as an environmental seal. The dielectric wall 220 seals the integrated circuit, wire bonds 230, and elements in the open space on the right from exposure to air. A lid 288 is not shown in FIGS. 2B, 2C and 2D, but can be provided as a top of the integrated circuit package 200 to complete the sealing of the open space on the right from exposure to air. That is, in the embodiment of FIGS. 2A to 2D, the integrated circuit package 200 may include the lid 288 that seals the integrated circuit package 200.

Therefore, at least a portion of the transmission line structure is sealed from exposure to air. The dielectric wall 220 also provides a seal for the cavity around the integrated circuit, though the dielectric wall 220 may be supplemented or replaced by an alternative without drawbacks of potting.

Additionally, the center transmission line 299 in the transmission line structure may be sealed with a sealant that seals the center transmission line 299. Sealant may also be used to seal ground wires. In the integrated circuit package 200 in FIGS. 2A to 2C, the center transmission line 299 runs from the PCB on the left in FIG. 2D to the first post 211, from the first post 211 to the second post 212, and from the second post 212 to the wire bonds 230. The signals in the center transmission line 299 ultimately run to and from the integrated circuit on the launch 291 of the integrated circuit.

The structure and materials of the integrated circuit package 200 in the embodiment of FIGS. 2A to 2D compensates for capacitance added by a variety of reasons. That is, the integrated circuit package 200 compensates for factors that otherwise hinder the impedance consistency in the signal path. For example, capacitance from soldering of the integrated circuit package 200 to the printed circuit board 205 is compensated. Additionally, the launch from the PCB 205 into the center transmission line 299 may play a significant role in performance at high frequencies. In the embodiment of FIGS. 2A to 2D, the integrated circuit package 200 compensates, for example, for capacitance from soldering of the integrated circuit package 200 to the printed circuit board and from bonds supporting the integrated circuit to the printed circuit board, such as bonds supporting the pedestal via 280 or bonds on the pedestal via 280 supporting the launch 291 of the integrated circuit. The necking of the first post 211 and the second post 212 of the integrated circuit package 200 is one aspect of the impedance control of a controlled impedance path from the printed circuit board to the integrated circuit in the embodiment of FIGS. 2A to 2D.

Although the embodiment of FIG. 2A to 2D shows the integrated circuit package 200 being used to package a single integrated circuit, the teachings for an integrated circuit package herein can also be used to package more than one integrated circuit in a single integrated circuit package. Moreover, tightly controlled transmission line structures as described herein can also be used to interface multiple integrated circuits, and not just an integrated circuit to a printed circuit board. That is, a transmission line package may alternatively include a transmission line structure running from a first integrated circuit to a second integrated circuit, while still including the center transmission line 299 provided between two ground lines and sealed from exposure to air as an environmental seal.

The design of the integrated circuit package 200 in FIGS. 2A to 2D can be fabricated while still maintaining control of electrical impedance of the transmission line assembly. As a result, an integrated circuit package 200 can be manufactured with the PCB 205 and the integrated circuit in mass production with available manufacturing methods. The fabrication of the disclosure can be accomplished by a variety of currently available fabrication techniques including conventional machining as well as microfabrication devices. For example, using conventional machining, the dielectric materials and layers can be provided separately from the metal trace, and they can be assembled and glued into place such as by using a keying feature to properly place the assembly. Alternatively, using microfabrication, the metal trace and dielectric materials and layers can be selectively co-deposited in a progressive process as is understood in the electronics field.

Figure 3:
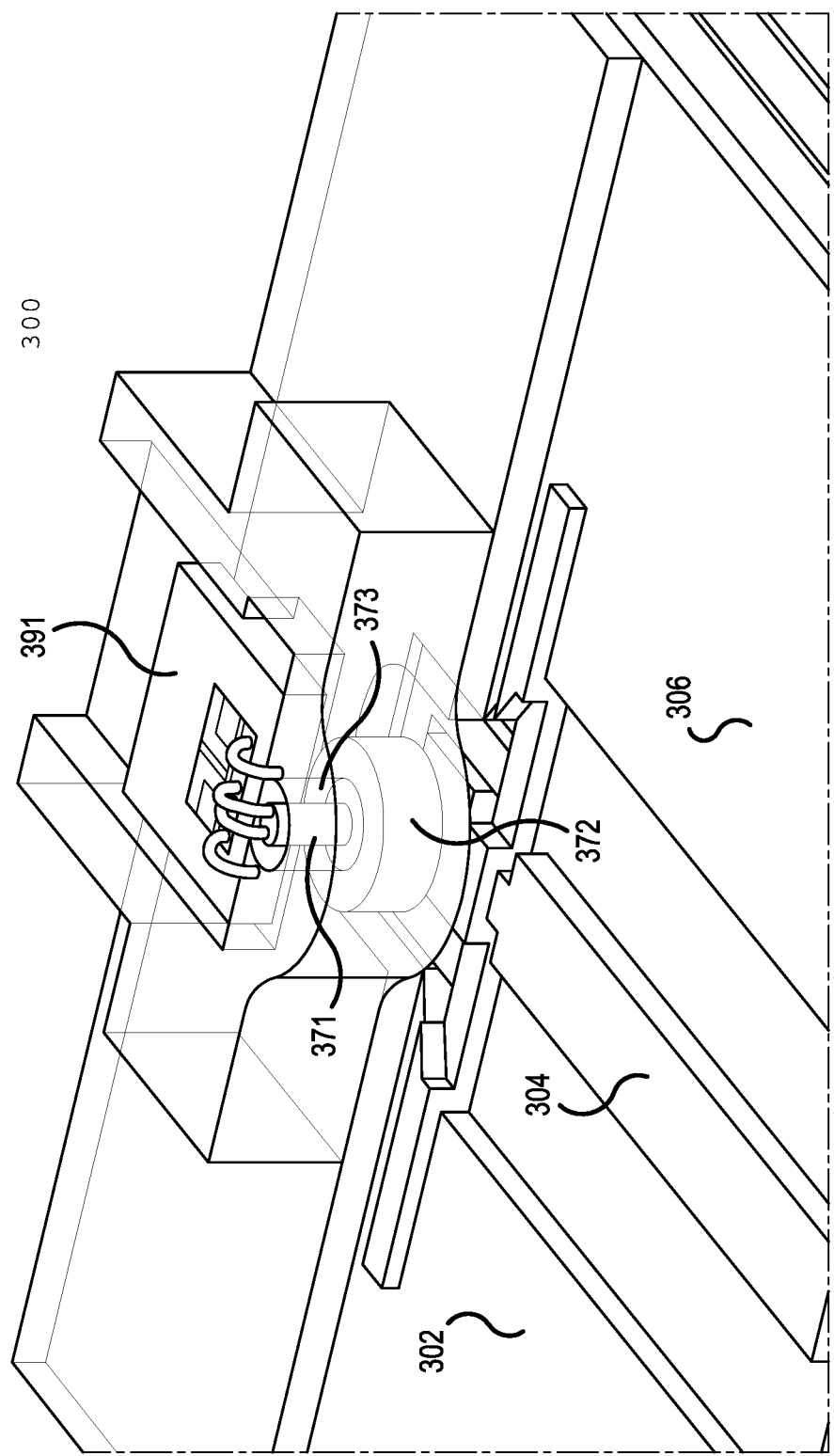
FIG. 3 illustrates a front perspective of another integrated circuit package, according to representative embodiments.

FIG. 3 illustrates a front perspective of another integrated circuit package, according to representative embodiments.

In FIG. 3, an integrated circuit package 300 includes three sections of a lowest layer on the bottom, including a first section 302 on the left, a second section 304 in the middle, and a third section 306 on the right. A coaxial transmission structure 372 includes a center conductor 371 and an outer insulating layer 373. The integrated circuit is supported by the launch 291. The insulating layer 373 may be a metal ground layer around the center conductor.

In the embodiment of FIG. 3, impedance control from the PCB to the integrated circuit is accomplished via the coaxial transmission structure 372, as compared to a stripline structure as shown in the embodiment of FIGS. 2A to 2D. The embodiment of FIG. 3 illustrates that the teachings herein are independent of the geometry of the center transmission line 299 and ground lines. The integrated circuit package 300 in FIG. 3 is also enclosed by a separate lid (not shown) to seal the integrated circuit package 300, though the lid is again removed from the figure for clarity.

In FIG. 3, two of the bond wires (not labelled) are shown connecting to the center conductor 371, and two of the bond wires are connected to ground at the outer insulating layer 373. In the embodiment of FIG. 3, the capacitance being offset by the integrated circuit package 300 is again the capacitance of bond pads connecting the PCT to the integrated circuit package 300, and capacitance of the integrated circuit on the launch 391 of the integrated circuit.

As described above, in the embodiment of FIG. 3, the transmission line structure implemented by the integrated circuit package 300 includes a coaxial transmission line. Multiple of the bond wires each connect the center conductor 371 of the coaxial transmission line 372 to the integrated circuit.

Figure 4:
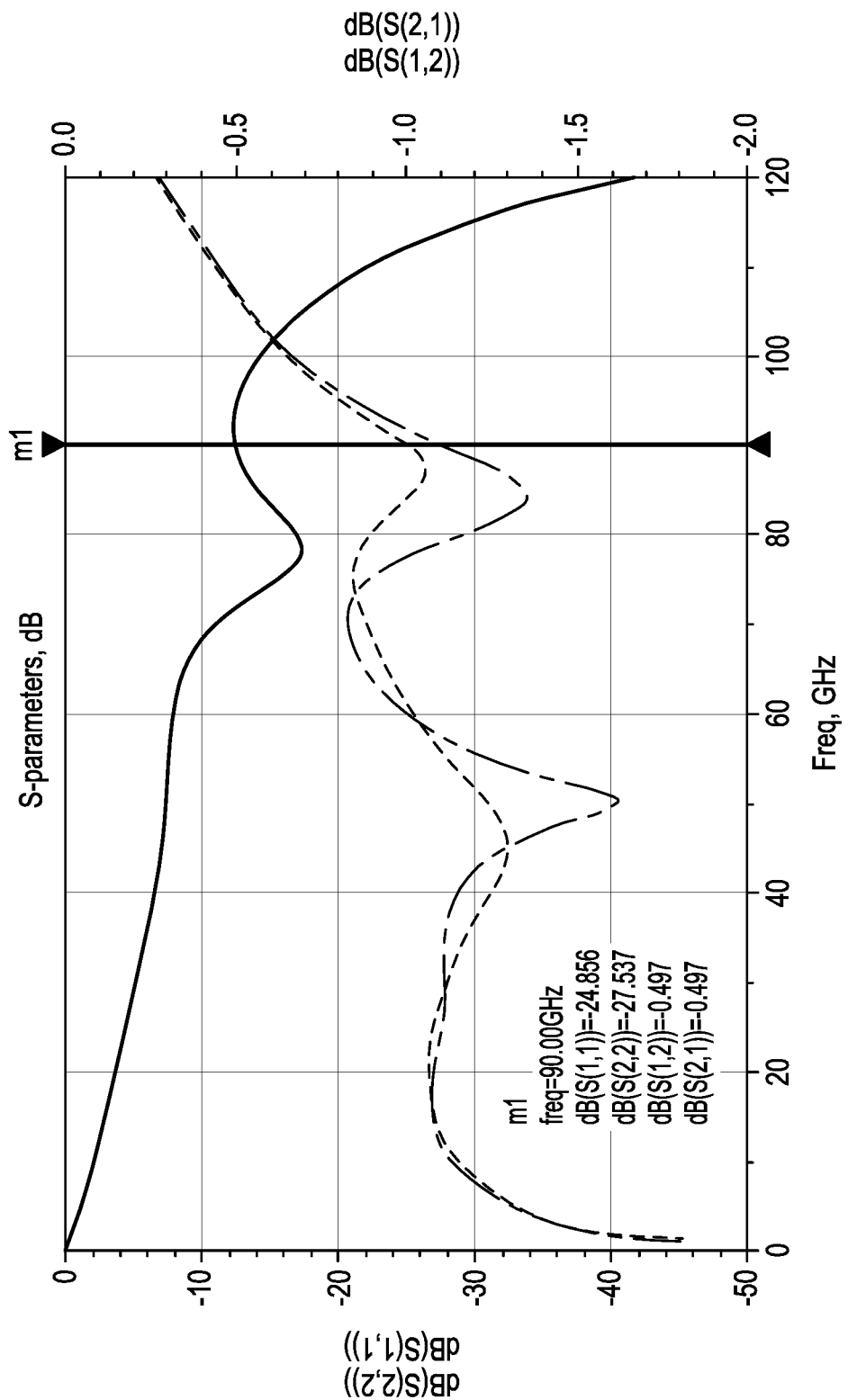
FIG. 4 illustrates a plot of return loss and insertion loss for the integrated circuit package in FIGS. 2A, 2B, 2C and 2D, according to representative embodiments.

FIG. 4 illustrates a plot of return loss and insertion loss for the integrated circuit package in FIGS. 2A, 2B and 2C, according to representative embodiments.

In FIG. 4, the simulated performance of the embodiment of FIGS. 2A to 2D is shown by the return loss (i.e. S(1,1), S(2,2)) as well as insertion loss (i.e. S(1,2), S(2,1)). FIG. 4, the plot shows effective matching up to 90 or 95 GHz. The line starting from the 0,0 origin and trending down towards the right shows deviation from not closing the lid 288 in the embodiment in FIG. 2A during the testing resulting in the plot of FIG. 4. If the lid 288 was provided, the matching between the two dashed lines would be closer in FIG. 4. In FIG. 4, energy is being radiated to bonding positions. S(1,1) and S(2,2) around 90 GHz are less than −20 dB, which means they are effectively matched, and this impedance matching is not achieved with current QFM technology.

Inasmuch as a launch is often considered suitable for use with a reflection loss better than 15 dB performance, the launch results in FIG. 4 show that the embodiment of FIG. 2A to 2D is usable to 100 GHz. As shown in FIG. 4, the integrated circuit package 200 of the embodiment of FIGS. 2A to 2D maintains impedance from the printed circuit board 205 to the integrated circuit such that reflection loss of the integrated circuit package is better than 15 dB performance at a portion of spectrum above 90 GHz.

As described above, an integrated circuit package according to the present disclosure provides tight control of the impedance of the transition from the PCB to the integrated circuit. High frequency performance of the transmission line structure can be improved by controlling the impedance, and the improvement can be enhanced by minimizing the length of the wire bonds 230 and the bond wires 330, such as placing leads of the center transmission line 299 as close to the integrated circuit as possible. In the embodiment of FIGS. 2A to 2D, this can be accomplished in two ways: either by extending the signal ground structure of the integrated circuit packager close to the launch 291 on the integrated circuit or by selectively sizing the overall integrated circuit package based on the electrical characteristics (e.g., impedance) of the integrated circuit. These methods may be used either separately or in combination.

Accordingly, the integrated circuit packages described herein provide impedance matching, such as with the wire bonds 230 and bond wires 330, along with an air cavity sealed by an environmental seal such as dielectric wall 220. These features and others are provided by a comprehensive design that maximizes the impedance matching for the transmission line structure such as to 50 Ohms up to 100 GHz. The integrated circuit packages described herein can be sealed for environmental performance without degrading the electrical performance of the integrated circuit. Additionally, as described herein the PCB that supports the integrated circuit package can be designed with materials that support high frequency operations of the integrated circuit. And, as explained above, the signal lead and ground lines from the integrated circuit package can be extended to the integrated circuit in order to optimize high frequency performance.

Although high-performance integrated circuit packaging platform compatible with surface mount assembly has been described with reference to several exemplary embodiments, it is understood that the words that have been used are words of description and illustration, rather than words of limitation. Changes may be made within the purview of the appended claims, as presently stated and as amended, without departing from the scope and spirit of high-performance integrated circuit packaging platform compatible with surface mount assembly in its aspects. Although high-performance integrated circuit packaging platform compatible with surface mount assembly has been described with reference to particular means, materials and embodiments, high-performance integrated circuit packaging platform compatible with surface mount assembly is not intended to be limited to the particulars disclosed; rather high-performance integrated circuit packaging platform compatible with surface mount assembly extends to all functionally equivalent structures, methods, and uses such as are within the scope of the appended claims.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

The invention claimed is:

1. An integrated circuit package, comprising:
a transmission line structure running from a printed circuit board (PCB) to an integrated circuit (IC) and including a center transmission line between two ground lines and sealed from exposure to air;
wire bonds that connect the transmission line structure to pads on the integrated circuit from where the center transmission line exits the integrated circuit package, and selected to have an impedance matched to an impedance of the integrated circuit;
a first post that supports the center transmission line where the center transmission line enters the integrated circuit package from the printed circuit board; and
a second post that supports the center transmission line where the center transmission line exits the integrated circuit package to connect to the wire bonds.

2. The integrated circuit package of claim 1, wherein the center transmission line of the transmission line structure is encapsulated in dielectric material.

3. The integrated circuit package of claim 1, further comprising: an air cavity around the integrated circuit and a launch for the integrated circuit.

4. The integrated circuit package of claim 1, further comprising:
a dielectric wall through which the center transmission line passes, which seals the integrated circuit from exposure to air and which supports the center transmission line between the first post and the second post.

5. The integrated circuit package of claim 1, further comprising: a lid that seals the integrated circuit package.

6. The integrated circuit package of claim 1,
wherein the integrated circuit package maintains impedance from the printed circuit board to the integrated circuit such that reflection loss of the integrated circuit package is better than 15 dB performance at a portion of spectrum above 90 GHz.

7. The integrated circuit package of claim 6, wherein the integrated circuit package compensates for capacitance from soldering of the integrated circuit package to the printed circuit board and from bonds supporting the integrated circuit to the printed circuit board.

8. The integrated circuit package of claim 7, wherein the second post serves as a power capacitor to compensate for inductance of the bonds supporting the integrated circuit to the printed circuit board.

9. The integrated circuit package of claim 1, wherein the integrated circuit package comprises a plurality of layers that are maintained through the transmission line structure, the first post and the second post.

10. The integrated circuit package of claim 1, further comprising: dielectric material that holds the first post in position.

11. The integrated circuit package of claim 1, further comprising: a pedestal via that supports the integrated circuit to the printed circuit board, and dielectric disposed around on the pedestal via.

12. The integrated circuit package of claim 1,
wherein the transmission line structure comprises a coaxial transmission line, wherein a plurality of the wire bonds each connect a center conductor of the coaxial transmission line to the integrated circuit.

13. The integrated circuit package of claim 1, wherein the integrated circuit package provides a controlled impedance path from the printed circuit board to the integrated circuit.

14. The integrated circuit package of claim 1, further comprising:
a coating around the center transmission line that seals the center transmission line from exposure to air.

15. The integrated circuit package of claim 1,
wherein the first post and the second post provide a necking of the transmission line structure to provide compensation for capacitance resulting from connecting the printed circuit board to the integrated circuit package.

16. The integrated circuit package of claim 1, wherein the two ground lines are extended to end proximate to the integrated circuit.

17. An integrated circuit package, comprising:
a transmission line structure running from a first integrated circuit (IC) to a second integrated circuit (IC) and including a center transmission line between two ground lines and sealed from exposure to air;
wire bonds that connect the transmission line structure to pads on the second integrated circuit from where the center transmission line exits the integrated circuit package, and selected to have an impedance matched to an impedance of the second integrated circuit;
a first post that supports the center transmission line where the center transmission line enters the integrated circuit package from the first integrated circuit; and
a second post that supports the center transmission line where the center transmission line exits the integrated circuit package to connect to the wire bonds.

18. An integrated circuit package, comprising:
a transmission line structure that includes a center transmission line provided between two ground lines, sealed from exposure to air, and running from a printed circuit board (PCB) to an integrated circuit (IC);
wire bonds that connect the transmission line structure to pads on the integrated circuit from where the center transmission line exits the integrated circuit package, and selected to have an impedance matched to an impedance of the integrated circuit;
a first post that supports the center transmission line where the center transmission line enters the integrated circuit package from the printed circuit board;
a second post that supports the center transmission line where the center transmission line exits the integrated circuit package to connect to the wire bonds; and
a dielectric wall through which the center transmission line passes, which seals the integrated circuit from exposure to air and which supports the center transmission line between the first post and the second post.

19. The integrated circuit package of claim 18,
wherein the integrated circuit package maintains impedance from the printed circuit board to the integrated circuit such that reflection loss of the integrated circuit package is better than 15 dB performance at a portion of spectrum above 90 GHz.

20. The integrated circuit package of claim 18, wherein the integrated circuit package provides a controlled impedance path from the printed circuit board to the integrated circuit.

\* \* \* \* \*